United States Patent
Hikosaka et al.

(10) Patent No.: US 12,094,934 B2
(45) Date of Patent: *Sep. 17, 2024

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Toshiki Hikosaka, Kawasaki (JP); Jumpei Tajima, Mitaka (JP); Shinya Nunoue, Ichikawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/471,372

(22) Filed: Sep. 21, 2023

(65) Prior Publication Data
US 2024/0014273 A1 Jan. 11, 2024

Related U.S. Application Data

(60) Division of application No. 17/985,538, filed on Nov. 11, 2022, now Pat. No. 11,817,483, which is a (Continued)

(30) Foreign Application Priority Data
Jan. 20, 2020 (JP) ................................. 2020-006880

(51) Int. Cl.
*H01L 29/207* (2006.01)
*H01L 29/417* (2006.01)
(Continued)

(52) U.S. Cl.
CPC ...... *H01L 29/207* (2013.01); *H01L 29/41775* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | |
|---|---|---|
| 8,604,591 B2 | 12/2013 | Yokogawa et al. |
| 10,199,476 B2 | 2/2019 | Nakayama et al. |

(Continued)

FOREIGN PATENT DOCUMENTS

| | | |
|---|---|---|
| JP | 11-251687 A | 9/1999 |
| JP | 2004-311913 A | 11/2004 |

(Continued)

*Primary Examiner* — Jack S Chen
(74) *Attorney, Agent, or Firm* — Oblon, McClelland, Maier & Neustadt, L.L.P.

(57) ABSTRACT

According to one embodiment, a semiconductor device includes a substrate, and a first semiconductor layer including magnesium and $Al_{x1}Ga_{1-x1}N$. The first semiconductor layer includes first, second, and third regions. The first region is between the substrate and the third region. The second region is between the first and third regions. A first concentration of magnesium in the first region is greater than a third concentration of magnesium in the third region. A second concentration of magnesium in the second region decreases along a first orientation. The first orientation is from the substrate toward the first semiconductor layer. A second change rate of a logarithm of the second concentration with respect to a change of a position along the first orientation is greater than a third change rate of a logarithm of the third concentration with respect to the change of the position along the first orientation.

17 Claims, 10 Drawing Sheets

Related U.S. Application Data continuation of application No. 17/015,378, filed on Sep. 9, 2020, now Pat. No. 11,581,407.

(51) Int. Cl.
*H01L 29/66* (2006.01)
*H01L 29/778* (2006.01)

(56) References Cited

U.S. PATENT DOCUMENTS

| | | |
|---|---|---|
| 11,581,407 B2 * | 2/2023 | Hikosaka .......... H01L 21/02579 |
| 2010/0127275 A1 | 5/2010 | Takehiko et al. |
| 2021/0313432 A1 | 10/2021 | Tajima et al. |

FOREIGN PATENT DOCUMENTS

| | | |
|---|---|---|
| JP | 2010-153837 A | 7/2010 |
| JP | WO 2011/135862 A1 | 11/2011 |
| JP | 5325534 B2 | 10/2013 |
| JP | 2015-115371 A | 6/2015 |
| JP | 2018-121001 A | 8/2018 |

* cited by examiner

SEMICONDUCTOR DEVICE AND METHOD FOR MANUFACTURING THE SAME

CROSS-REFERENCE TO RELATED APPLICATIONS

This application is a divisional of and claims benefit under 35 U.S.C. § 120 to U.S. application Ser. No. 17/985,538, filed Nov. 11, 2022, which is a continuation of and claims benefit under 35 U.S.C. § 120 to U.S. application Ser. No. 17/015,378, filed Sep. 9, 2020 (now U.S. Pat. No. 11,581, 407), which is based upon and claims the benefit of priority under 35 U.S.C. § 119 from Japanese Patent Application No. 2020-006880, filed on Jan. 20, 2020, the entire contents of each of which are incorporated herein by reference.

FIELD

Embodiments of the invention generally relate to a semiconductor device and a method for manufacturing the semiconductor device.

BACKGROUND

For example, it is desirable to improve the characteristics of a semiconductor device such as a transistor or the like.

DETAILED DESCRIPTION

Figure 1:
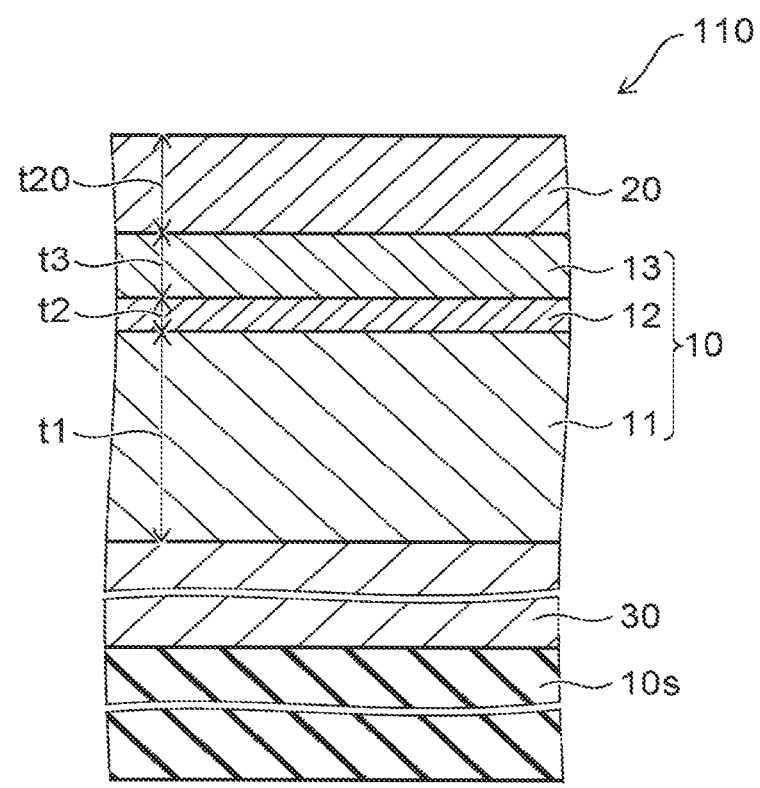
FIG. 1 is a schematic cross-sectional view illustrating a semiconductor device according to a first embodiment.

According to one embodiment, a semiconductor device includes a substrate, and a first semiconductor layer including magnesium and $Al_{x1}Ga_{1-x1}N$ (0≤x1<1). The first semiconductor layer includes a first region, a second region, and a third region. The first region is between the substrate and the third region. The second region is between the first region and the third region. A first concentration of magnesium in the first region is greater than a third concentration of magnesium in the third region. A second concentration of magnesium in the second region decreases along a first orientation. The first orientation is from the substrate toward the first semiconductor layer. A second change rate of a logarithm of the second concentration with respect to a change of a position along the first orientation is greater than a third change rate of a logarithm of the third concentration with respect to the change of the position along the first orientation.

According to one embodiment, a semiconductor device includes a substrate, and a first semiconductor layer including magnesium and $Al_{x1}Ga_{1-x1}N$ (0≤x1<1). The first semiconductor layer includes a first region, a second region, and a third region. The first region is between the substrate and the third region. The second region is between the first region and the third region. A first concentration of magnesium in the first region is greater than a third concentration of magnesium in the third region. A second concentration of magnesium in the second region decreases along a first orientation. The first orientation is from the substrate toward the first semiconductor layer. The third region includes carbon, and the second region does not include carbon, or a concentration of carbon in the third region is greater than a concentration of carbon in the second region.

According to one embodiment, a method for manufacturing a semiconductor device is disclosed. The method can include preparing a substrate, and forming a first semiconductor layer on the substrate by using a gas. The gas includes ammonia, a raw material including gallium, and a raw material including magnesium. The first semiconductor layer includes magnesium and $Al_{x1}Ga_{1-x1}N$ (0≤x1<1). The forming of the first semiconductor layer includes forming a first region by using a first gas with a first partial pressure of ammonia. The first gas includes ammonia, a raw material including gallium, and a raw material including magnesium. The forming of the first semiconductor layer includes, after the forming of the first region, forming a second region by using a second gas with a second partial pressure of ammonia. The second gas includes ammonia and a raw material including gallium. The second partial pressure is greater than the first partial pressure. The forming of the first semiconductor layer includes, after the forming of the second region, forming a third region by using a third gas with a third partial pressure of ammonia. The third gas includes ammonia and a raw material including gallium. The third partial pressure is less than the second partial pressure.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a substrate 10s and a first semiconductor layer 10. In the example, the semiconductor device 110 further includes a second semiconductor layer 20.

The semiconductor device 110 may further include a third semiconductor layer 30.

The first semiconductor layer 10 includes magnesium and $Al_{x1}Ga_{1-x1}N$ ($0 \leq x1 < 1$). The first semiconductor layer 10 includes, for example, GaN including Mg. The first semiconductor layer 10 is, for example, a p-type GaN layer.

The second semiconductor layer 20 includes $Al_{x2}Ga_{1-x2}N$ ($0 < x2 \leq 1$ and $x1 < x2$). The second semiconductor layer 20 includes, for example, AlGaN. The composition ratio of Al in the second semiconductor layer 20 is, for example, not less than 0.1 and not more than 0.4. The first semiconductor layer 10 is between the substrate 10s and the second semiconductor layer 20.

The third semiconductor layer 30 includes a nitride semiconductor including Al. The third semiconductor layer 30 includes, for example, AlN. The third semiconductor layer 30 may include multiple AlGaN films having different composition ratios of Al. The third semiconductor layer 30 is between the substrate 10s and the first semiconductor layer 10. The third semiconductor layer 30 is, for example, a buffer layer.

For example, the third semiconductor layer 30 is formed on the substrate 10s. The first semiconductor layer 10 is formed on the third semiconductor layer 30. The second semiconductor layer 20 is formed on the first semiconductor layer 10.

In the embodiment, the first semiconductor layer 10 includes a first region 11, a second region 12, and a third region 13. The first region 11 is between the substrate 10s and the third region 13. The second region 12 is between the first region 11 and the third region 13.

The concentration (a first concentration) of magnesium in the first region 11 is greater than the concentration (a third concentration) of magnesium in the third region 13. The concentration (a second concentration) of magnesium in the second region 12 decreases along a first orientation, which is from the substrate 10s toward the first semiconductor layer 10.

The first orientation is along a Z-axis direction. A direction perpendicular to the Z-axis direction is taken as an X-axis direction. A direction perpendicular to the Z-axis direction and the X-axis direction is taken as a Y-axis direction.

For example, the upper surface (the surface facing the first semiconductor layer 10) of the substrate 10s is substantially parallel to the X-Y plane. The first semiconductor layer 10 spreads along the X-Y plane. The second semiconductor layer 20 spreads along the X-Y plane. The third semiconductor layer 30 spreads along the X-Y plane.

The first orientation (the +Z orientation) corresponds to the stacking direction of the substrate 10s and the first semiconductor layer 10.

As described below, for example, a two-dimensional electron gas is generated at the vicinity of the interface between the first semiconductor layer 10 and the second semiconductor layer 20. The two-dimensional electron gas is used as a current path. For example, a source electrode, a drain electrode, and a gate electrode are provided on the second semiconductor layer 20. A current that flows between the source electrode and the drain electrode can be controlled by controlling the potential of the gate electrode. For example, the semiconductor device 110 can function as a transistor. For example, by using the first semiconductor layer 10 including Mg in such an example, the threshold voltage can be increased. For example, a normally-off characteristic is more easily obtained.

In one example, a thickness t20 (the thickness along the first orientation) of the second semiconductor layer 20 is not less than 5 nm and not more than 40 nm.

In one example, a thickness t1 (the thickness along the first orientation) of the first region 11 is not less than 100 nm and not more than 1000 nm. In one example, a thickness t2 (the thickness along the first orientation) of the second region 12 is not less than 5 nm and not more than 200 nm. In one example, a thickness t3 (the thickness along the first orientation) of the third region 13 is not less than 10 nm and not more than 1000 nm. The first thickness t1 is the thickness of the first region 11 along the Z-axis direction. The second thickness t2 is the thickness of the second region 12 along the Z-axis direction. The third thickness t3 is the thickness of the third region 13 along the Z-axis direction.

In the embodiment as described above, the first semiconductor layer 10 (e.g., the GaN layer) includes three regions (the first to third regions 11 to 13) having different concentrations of Mg. An example of the concentrations of Mg of the semiconductor device 110 will now be described.

Figure 2:
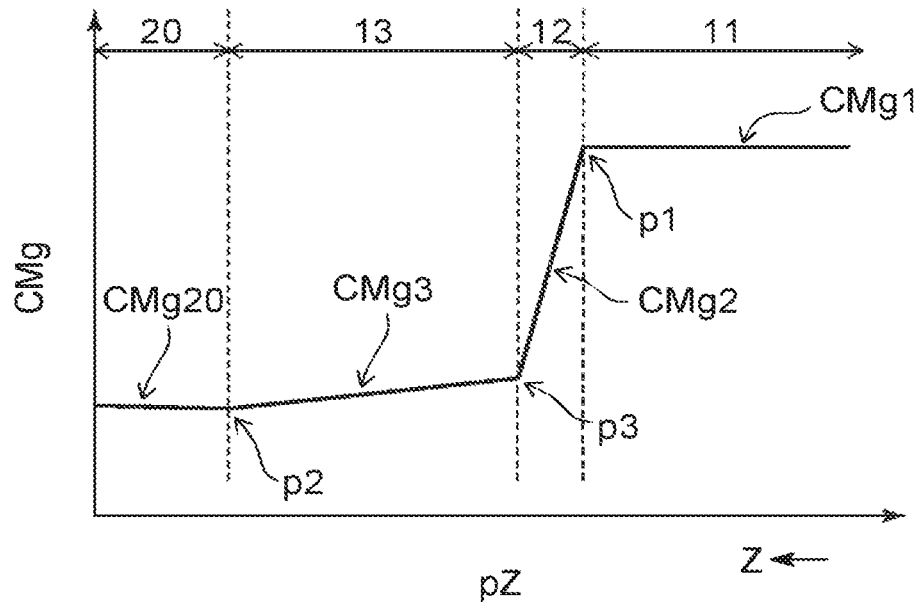
FIG. 2 is a graph illustrating the semiconductor device according to the first embodiment.

FIG. 2 is a graph illustrating the semiconductor device according to the first embodiment.

The horizontal axis of FIG. 2 is a position pZ along the Z-axis direction. In the graph, the orientation from the right toward the left corresponds to the first orientation (the +Z orientation). The vertical axis of FIG. 2 is a magnesium concentration logarithm CMg. FIG. 2 shows a logarithm CMg1 of the first concentration of magnesium in the first region 11, a logarithm CMg2 of the second concentration of magnesium in the second region 12, and a logarithm CMg3 of the third concentration of magnesium in the third region 13. FIG. 2 also shows a logarithm CMg20 of the magnesium concentration in the second semiconductor layer 20.

As shown in FIG. 2, the first concentration (the logarithm CMg1) of magnesium in the first region 11 is greater than the third concentration (the logarithm CMg3) of magnesium in the third region 13. The second concentration (the logarithm CMg2) of magnesium in the second region 12 decreases along the first orientation (the orientation from the substrate 10s toward the first semiconductor layer 10).

As shown in FIG. 2, a second change rate of the logarithm CMg2 of the second concentration with respect to the change of the position pZ along the first orientation is greater than a third change rate of the logarithm CMg3 of the third concentration with respect to the change of the position pZ along the first orientation. The second change rate of the logarithm CMg2 of the second concentration with respect to the change of the position pZ along the first orientation is greater than a first change rate of the logarithm CMg1 of the first concentration with respect to the change of the position pZ along the first orientation. The absolute value of the second change rate of the logarithm CMg2 of the second concentration with respect to the change of the position pZ along the first orientation is, for example, greater than the absolute value of the third change rate of the logarithm CMg3 of the third concentration with respect to the change of the position pZ along the first orientation. The absolute value of the second change rate of the logarithm CMg2 of the second concentration with respect to the change of the position pZ along the first orientation is, for example, greater than the absolute value of the first change rate of the logarithm CMg1 of the first concentration with respect to the change of the position pZ along the first orientation.

The second change rate corresponds to the gradient of the logarithm CMg2 of the second concentration in the second region 12. The third change rate corresponds to the gradient of the logarithm CMg3 of the third concentration in the third region 13. The first change rate corresponds to the gradient of the logarithm CMg1 of the first concentration in the first region 11.

Thus, in the embodiment, a second region 12 in which the concentration of magnesium abruptly changes is provided, and the third region 13 in which the change rate of the magnesium concentration is small (or does not change) is provided.

As described above, the two-dimensional electron gas is formed in the first semiconductor layer 10 at the vicinity of the second semiconductor layer 20. The two-dimensional electron gas is provided in the third region 13 of the first semiconductor layer 10. If the magnesium concentration in the third region 13 is high, the movement of electrons is impeded by the Mg. The impedance by the Mg is suppressed by setting the magnesium concentration in the third region 13 to be low. High electron mobility is easily obtained thereby.

On the other hand, the threshold voltage can be effectively increased by setting the magnesium concentration in the first region 11 to be high. The second region 12 is a region in which the concentration of magnesium decreases from the first region 11 toward the third region 13.

For example, a first reference example may be considered in which the concentration of magnesium changes smoothly (e.g., linearly) from the position of the boundary between the first region 11 and the second region 12 (a point p1 in FIG. 2) toward the boundary between the third region 13 and the second semiconductor layer 20 (a point p2 in FIG. 2). In such a case, the threshold voltage greatly changes as the thickness between the point p1 and the point p2 changes. The threshold voltage is dependent on the concentration of magnesium. The threshold voltage decreases as the concentration of magnesium decreases.

In the embodiment, the magnesium concentration in the second region 12 changes in a step configuration with a high change rate. The change of the magnesium concentration is small in the third region 13. Thereby, for example, the threshold voltage is relatively resistant to change even when the thickness of the third region 13 changes.

For example, there are cases where the thickness of the third region 13 fluctuates due to fluctuation of the manufacturing processes, etc. According to the embodiment, the tolerance of the fluctuation of the thickness can be enlarged. In the embodiment, a practical semiconductor device in which the threshold voltage is stabilized is applicable. A semiconductor device can be provided in which the characteristics can be improved.

As described above, a high threshold voltage is obtained by providing the first region 11 having the high concentration of magnesium. According to the embodiment, a high threshold voltage is stably obtained even when the manufacturing conditions fluctuate.

In the embodiment, the second change rate (the second change rate of the logarithm CMg2 of the second concentration of Mg in the second region 12 with respect to the change of the position pZ along the first orientation) is, for example, not less than 0.01 and not more than 0.2. The absolute value of the second change rate is, for example, not less than 0.01 and not more than 0.2. In the example, the units of the second change rate are $(\log_{10}(1/cm^3))/nm$. Thereby, for example, the controllability of the threshold voltage is improved.

As shown in FIG. 2, the change of the magnesium concentration can be illustrated using a horizontal axis corresponding to the position pZ (nm) along the Z-axis direction and a vertical axis corresponding to the magnesium concentration logarithm CMg (units: $/cm^3$). In such a case, for example, a second change rate ΔCMg2 is represented using the magnesium concentration at the point p1 of FIG. 2 and the magnesium concentration at a point p3 of FIG. 2. The point p1 of FIG. 2 corresponds to the position of the boundary between the first region 11 and the second region 12. The point p3 of FIG. 2 corresponds to the position of the boundary between the second region 12 and the third region 13. The logarithm of the magnesium concentration at the point p1 is taken as CMg(p1) (units: $/cm^3$). The logarithm of the magnesium concentration at the point p3 is taken as CMg(p3) (units: $/cm^3$). The position along the Z-axis direction of the point p1 is taken as pZ(p1) (units: nm). The position along the Z-axis direction of the point p3 is taken as pZ(p3) (units: nm).

The second change rate ΔCMg2 is represented by $$\Delta CMg2=(\log_{10}(CMg(p1))-\log_{10}(CMg(p3)))/(pZ(p1)-pZ(p3)).$$

The units of the second change rate ΔCMg2 are $(\log_{10}(1/cm^3))/nm$.

In the embodiment, the third change rate (the third change rate of the logarithm CMg3 of the third concentration of Mg in the third region 13 with respect to the change of the position pZ along the first orientation) is, for example, not less than 0.0001 and not more than 0.002. The absolute value of the third change rate is, for example, not less than 0.0001 and not more than 0.002. In the example, the units of the third change rate are $(\log_{10}(1/cm^3))/nm$. Thereby, for example, the change of the threshold voltage when the thickness of the third region 13 changes can be reduced.

For example, a third change rate ΔCMg3 is represented using the magnesium concentration at the point p2 of FIG. 2 and the magnesium concentration at the point p3 of FIG. 2. The point p2 of FIG. 2 corresponds to the position of the boundary between the third region 13 and the second semiconductor layer 20. The logarithm of the magnesium concentration at the point p2 is taken as CMg(p2) (units: $/cm^3$). The position along the Z-axis direction of the point p2 is taken as pZ(p2) (units: nm).

The third change rate ΔCMg3 is represented by $$\Delta CMg3=(\log_{10}(CMg(p3))-\log_{10}(CMg(p2)))/(pZ(p3)-pZ(p2)).$$

The units of the third change rate ΔCMg3 are $(\log_{10}(1/cm^3))/nm$.

In the embodiment, the magnesium concentration in the second region 12 decreases in a step configuration. As described below, for example, such a profile is easily obtained using ingenuity of practical manufacturing conditions, etc. Examples of experiment results relating to manufacturing conditions of a GaN layer including magnesium (Mg) will now be described.

Figure 3:
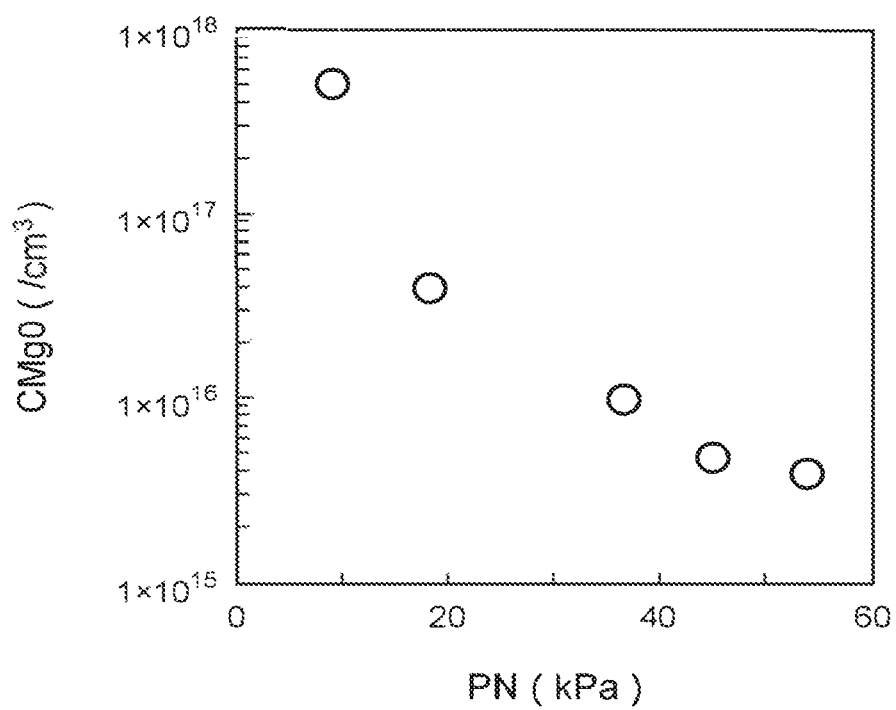
FIG. 3 is a graph illustrating a characteristic of the semiconductor device.

FIG. 3 is a graph illustrating a characteristic of the semiconductor device.

FIG. 3 shows the relationship for a GaN layer including Mg between a manufacturing condition and the concentration of Mg included in the GaN layer. The horizontal axis of FIG. 3 is a partial pressure PN (kPa) of ammonia when the GaN including Mg is grown. The vertical axis of FIG. 3 is a concentration CMg0 of Mg. The concentration CMg0 is shown logarithmically.

For example, GaN including Mg is grown using a gas including ammonia, a raw material including Ga (gallium), and a raw material including Mg. For example, the growth is performed by metal-organic chemical vapor deposition (MOCVD (Metal Organic Chemical Vapor Deposition)). The raw material that includes Ga is, for example, TMG (trimethylgallium). The raw material that includes Mg is, for example, $Cp_2Mg$ (bis cyclopentadienyl magnesium). In the example of FIG. 3, the ratio ($Cp_2Mg$/TMG) of the supply amount of $Cp_2Mg$ to the supply amount of TMG is $3.7 \times 10^{-6}$. The partial pressure of $Cp_2Mg$ is constant in the example of FIG. 3.

As shown in FIG. 3, the concentration CMg0 of Mg in the Ga decreases as the partial pressure PN of ammonia (the partial pressure of the ammonia gas) Increases. This means that the efficiency of incorporating Mg into the GaN decreases as the partial pressure PN of ammonia increases. For example, the concentration of Mg introduced to the GaN changes even when the partial pressure of $Cp_2Mg$ is constant.

Generally, it is considered that Mg remains inside the deposition apparatus (e.g., on the apparatus wall surfaces, etc.) after a GaN layer including Mg is grown. Therefore, there are cases where the remaining Mg is unintentionally incorporated into the GaN of a GaN layer not to include Mg that is grown after growing the GaN layer including Mg. In such a case, the Mg is unintentionally introduced to the GaN layer if the growth of the GaN layer that is not to include Mg is performed by employing conditions at which Mg is easily incorporated. Conversely, the introduction of Mg to the GaN layer can be suppressed if the growth of the GaN layer that is not to include Mg is performed by employing conditions at which Mg is not easily incorporated.

For example, by employing conditions that consider the efficiency of incorporating Mg, a GaN layer that does not include Mg (or has an appropriately low Mg concentration) is more easily obtained.

On the other hand, when the efficiency of incorporating Mg is not considered, Mg is unintentionally introduced to the GaN layer. Therefore, it is difficult to appropriately reduce the Mg concentration. In such a case, for example, the thickness of the GaN layer that is grown is increased until the Mg that remains inside the deposition apparatus is consumed and the concentration of Mg becomes low. Or, it is difficult to reduce the concentration of Mg.

For example, by employing conditions that consider the efficiency of incorporating Mg, a GaN layer that does not include Mg (or has an appropriately low Mg concentration) is more easily obtained.

FIGS. 4A to 4D are schematic cross-sectional views illustrating a method for manufacturing a semiconductor device.

Figure 4A:
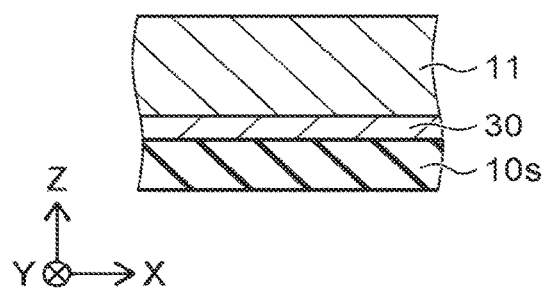
FIGS. 4A to 4D are schematic cross-sectional views illustrating a method for manufacturing a semiconductor device.

The substrate 10s is prepared as shown in FIG. 4A. For example, the third semiconductor layer 30 may be formed on the substrate 10s. The first region 11 is formed on the substrate 10s (in the example, on the third semiconductor layer 30). The first region 11 is formed using the first gas that includes ammonia, a raw material including gallium, and a raw material including magnesium. In the formation of the first region 11, the partial pressure PN of ammonia is a first partial pressure. The first partial pressure is relatively low. The first partial pressure is, for example, not less than 5 kPa and not more than 15 kPa.

Figure 4B:
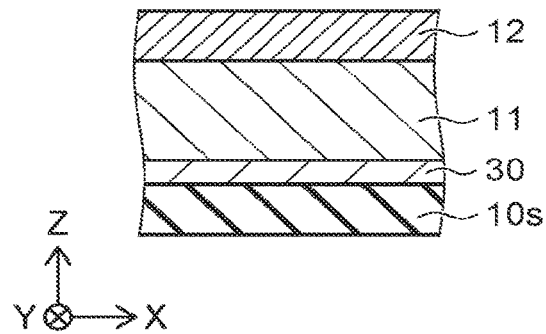

As shown in FIG. 4B, the second region 12 is formed after forming the first region 11. The second region 12 is formed using a second gas that includes ammonia and a raw material including gallium. A raw material that includes magnesium is not supplied in the formation of the third region 13. In the formation of the second region 12, the partial pressure PN of ammonia is a second partial pressure. The second partial pressure is greater than the first partial pressure. The second partial pressure is not less than 35 kPa and not more than 65 kPa. The second partial pressure may be not less than 36 kPa and not more than 60 kPa. Because the second partial pressure is high, even when Mg remains in the processing apparatus, Mg is not easily incorporated into the second region 12.

Figure 4C:
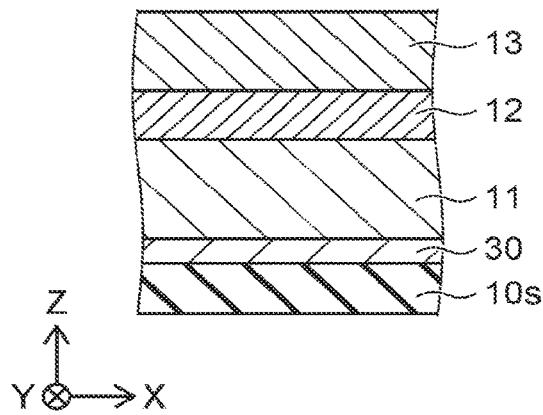

As shown in FIG. 4C, the third region 13 is formed after forming the second region 12. The third region 13 is formed using a third gas that includes ammonia and a raw material including gallium. A raw material that includes magnesium is not supplied in the formation of the third region 13. In the formation of the third region 13, the partial pressure PN of ammonia is a third partial pressure. For example, the third partial pressure may be less than the second partial pressure. The third partial pressure is, for example, not less than 20 kPa and not more than 35 kPa. For example, the Mg that remains in the processing apparatus is low when forming the third region 13. Therefore, even when the third partial pressure is less than the second partial pressure, Mg is not easily incorporated into the third region 13. For example, the third partial pressure may be equal to the second partial pressure. For example, because the Mg that remains in the processing apparatus is low, the third region 13 that has less incorporation of Mg can be formed.

For example, by using such manufacturing conditions, a profile is easily obtained in which the Mg concentration in the second region 12 decreases in a step configuration.

Figure 4D:
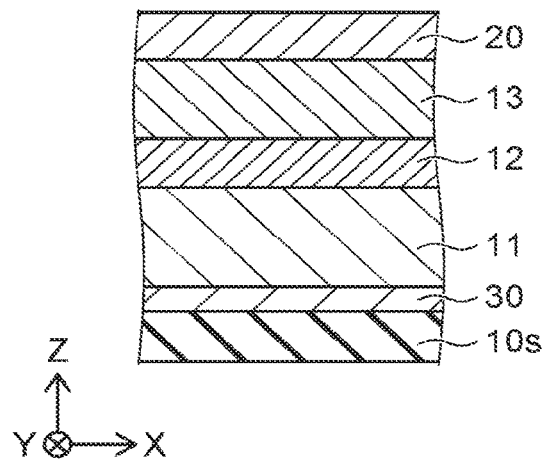

As shown in FIG. 4D, after forming the third region 13, the second semiconductor layer 20 is formed using a gas that includes a raw material including aluminum, a raw material including gallium, and ammonia.

Figure 5A:
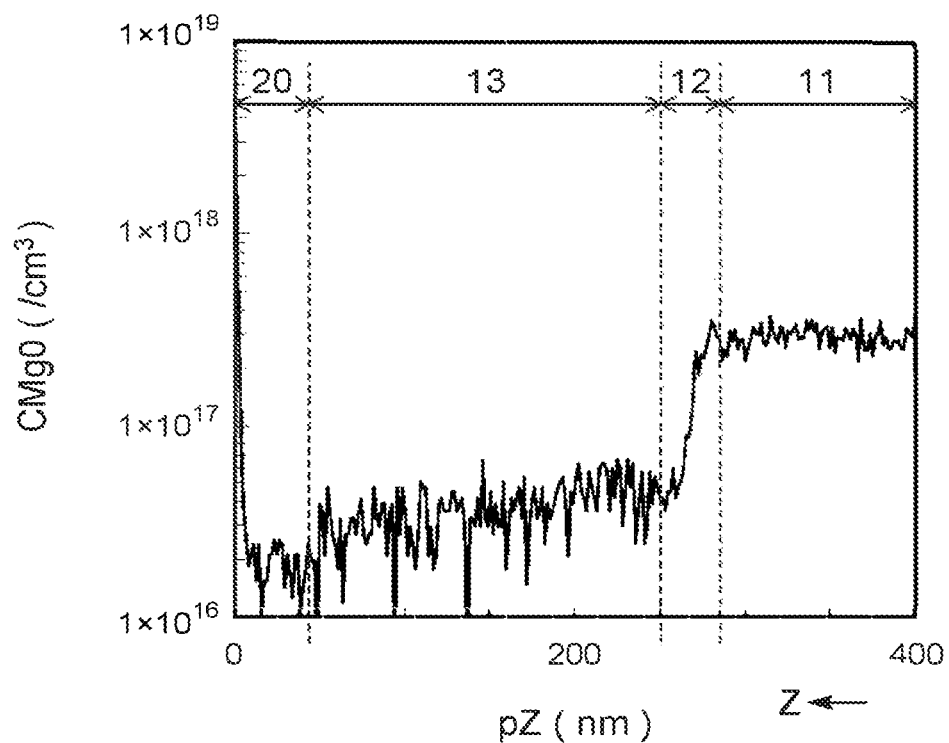
FIGS. 5A and 5B are graphs illustrating characteristics of semiconductor devices.
Figure 5B:
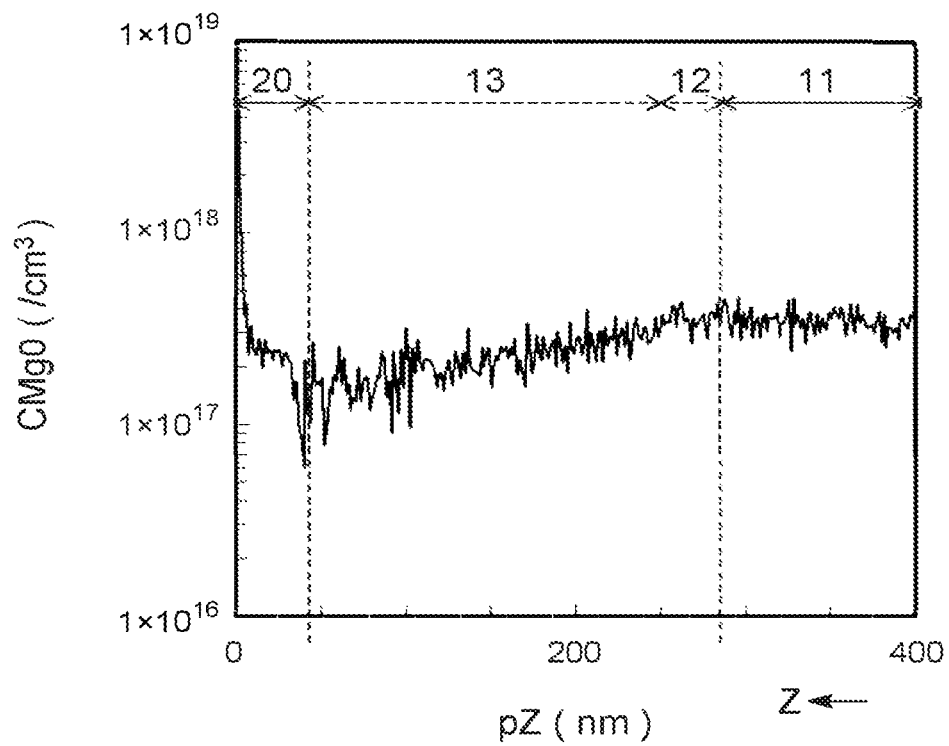

FIGS. 5A and 5B are graphs illustrating characteristics of semiconductor devices.

FIG. 5A illustrates analysis results of SIMS (Secondary Ion Mass Spectrometry) of the Mg concentration in a first sample SP1 manufactured with the conditions described above. When manufacturing the first sample SP1, the second partial pressure is greater than the first partial pressure. The third partial pressure is less than the second partial pressure and greater than the first partial pressure.

FIG. 5B illustrates SIMS analysis results of the Mg concentration in a second sample SP2. When manufacturing the second sample SP2, the second partial pressure is equal to the first partial pressure. The third partial pressure is equal to the first partial pressure. Accordingly, in the second sample SP2, the second region 12 and the third region 13 cannot be discriminated. For convenience, the regions that correspond respectively to the second and third regions 12 and 13 in the first sample SP1 are respectively considered to be the second and third regions 12 and 13 in the second sample SP2.

In FIGS. 5A and 5B, the horizontal axis is the position pZ in the Z-axis direction. The vertical axis is the concentration CMg0 of Mg.

In the first sample SP1 as shown in FIG. 5A, the concentration CMg0 of Mg in the first region 11 is high. The concentration CMg0 of Mg decreases in a step configuration in the second region 12. The concentration CMg0 of Mg in the third region 13 is low.

In the second sample SP2 as shown in FIG. 5B, the concentration CMg0 of Mg is high in the first region 11, the second region 12, and the third region 13. The concentration CMg0 of Mg substantially does not decrease. It is considered that this is caused by the Mg that remains in the processing apparatus being incorporated into the GaN because the second partial pressure is equal to the first partial pressure. For example, it is considered that the third partial pressure being equal to the first partial pressure causes the Mg remaining in the processing apparatus to be incorporated into the GaN. In the second sample SP2, the electron mobility of a transistor that uses the configuration of the second sample SP2 is low because the concentration CMg0 of Mg is high in the portion corresponding to the third region 13. For example, the on-resistance of the transistor is high.

An example of a characteristic of a transistor formed using such a first sample SP1 will now be described.

Figure 6:
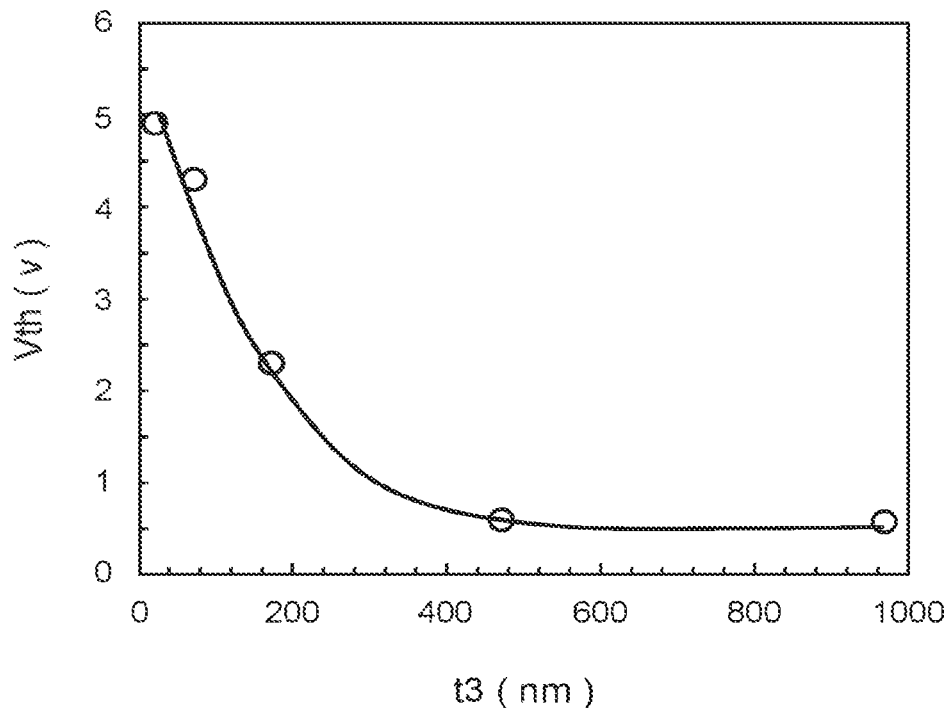
FIG. 6 is a graph illustrating a characteristic of the semiconductor device.

FIG. 6 is a graph illustrating a characteristic of the semiconductor device.

FIG. 6 illustrates the characteristic of a transistor formed using the condition of the first sample SP1 (in which the second partial pressure is greater than the first partial pressure). This figure shows measurement results of multiple samples having different thicknesses t3 of the third region 13. In this figure, the horizontal axis is the thickness t3 (nm) of the third region 13. The vertical axis is a threshold voltage Vth (V).

For the condition of the first sample SP1 as shown in FIG. 6, the threshold voltage Vth becomes substantially constant when the thickness t3 of the third region 13 becomes thick. For example, a stable threshold is obtained even when the thickness t3 of the third region 13 fluctuates.

In the embodiment, for example, it is favorable for the condition of the first sample SP1 described above to be employed. Thereby, the concentration CMg0 of Mg in the second region 12 changes in a step configuration having a high change rate. Thereby, a high threshold voltage Vth is stably obtained even when the thickness t3 of the third region 13 fluctuates. For example, a normally-off operation is stably obtained. For example, the tolerance of the fluctuation of the thickness can be enlarged. A practical semiconductor device that has a high threshold voltage Vth is applicable. Thereby, a semiconductor device can be provided in which the characteristics can be improved.

In the embodiment as shown in FIG. 2, the concentration (the third concentration) of Mg in the third region 13 may decrease along the first orientation (the +Z orientation). Thereby, the scattering of the electrons caused by the Mg is reduced, and high electron mobility is easily obtained. For example, high electron mobility is easily obtained in the two-dimensional electron gas formed at the interface between the second semiconductor layer 20 and the third region 13.

As shown in FIG. 2, for example, the first change rate of the logarithm of the concentration (the first concentration) of Mg in the first region 11 with respect to the change of the position pZ along the first orientation (the +Z orientation) is less than the change rate (the third change rate) of the logarithm of the concentration (the third concentration) of Mg in the third region 13 with respect to the change of the position pZ along the first orientation (the +Z orientation). The absolute value of the first change rate of the logarithm of the concentration (the first concentration) of Mg in the first region 11 with respect to the change of the position pZ along the first orientation (the +Z orientation) is, for example, less than the absolute value of the change rate (the third change rate) of the logarithm of the concentration (the third concentration) of Mg in the third region 13 with respect to the change of the position pZ along the first orientation (the +Z orientation).

In the embodiment, for example, the average value in the third region 13 of the third concentration (the concentration CMg0 of Mg in the third region 13) is not more than 1/10 of the average value in the first region of the first concentration (the concentration CMg0 of Mg in the first region 11). By setting the average value of the third concentration to be low, for example, high electron mobility is easily obtained.

The average value in the third region 13 of the third concentration is, for example, $5 \times 10^{16}/cm^3$ or less. The average value in the third region 13 of the third concentration may be, for example, $2 \times 10^{16}/cm^3$ or less. The average value in the third region 13 of the third concentration may be, for example, $1 \times 10^{16}/cm^3$ or less.

In the embodiment, for example, the average value in the first region 11 of the first concentration (the concentration CMg0 of Mg in the first region 11) is, for example, $5 \times 10^{16}/cm^3$ or more. The average value in the first region 11 of the first concentration may be, for example, $1 \times 10^{19}/cm^3$ or less. The average value in the first region 11 of the first concentration may be, for example, $5 \times 10^{18}/cm^3$ or less.

In the embodiment, the first semiconductor layer 10 may include carbon. An example of a profile of the carbon concentration in the first semiconductor layer 10 will now be described.

Figure 7:
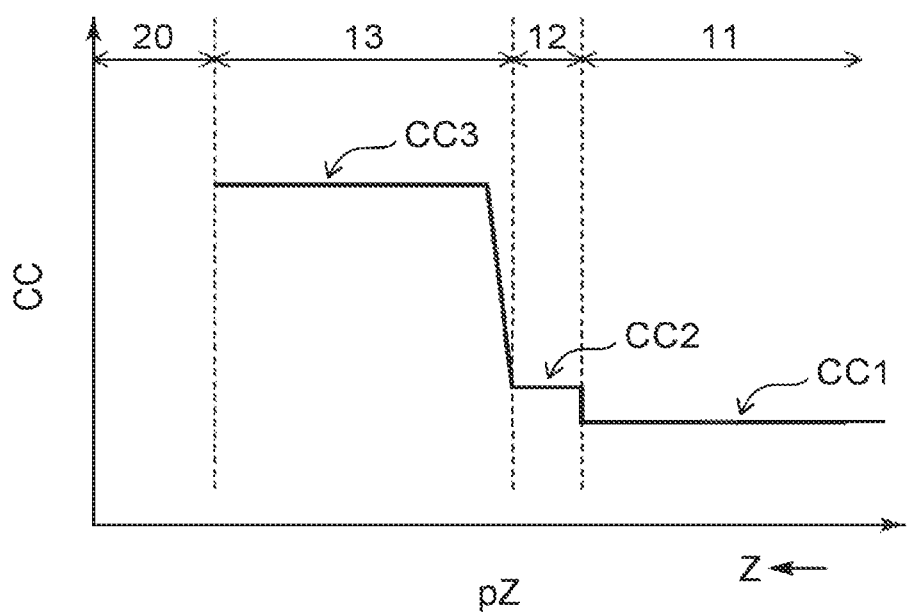
FIG. 7 is a graph illustrating the semiconductor device according to the first embodiment.

FIG. 7 is a graph illustrating the semiconductor device according to the first embodiment.

The horizontal axis of FIG. 7 is the position pZ along the Z-axis direction. In the graph, the orientation from the right toward the left corresponds to the first orientation (the +Z orientation). The vertical axis of FIG. 7 is a carbon concentration logarithm CC. FIG. 7 shows a logarithm CC1 of the carbon concentration in the first region 11, a logarithm CC2 of the carbon concentration in the second region 12, and a logarithm CC3 of the carbon concentration in the third region 13.

As shown in FIG. 7, the concentration (the logarithm CC3) of carbon in the third region 13 is greater than the concentration (the logarithm CC2) of carbon in the second region 12. Or, the third region 13 may include carbon, and the second region 12 may not include carbon.

For example, the incorporation of Mg into the third region 13 can be suppressed by incorporating carbon into the third region 13. For example, in a p-type region, carbon acts as an n-type impurity. For example, carbon suppresses the function of Mg as a p-type impurity. For example, the Mg can be compensated by the carbon existing in the third region 13.

For example, by setting the carbon concentration in the second region 12 to be low, the concentration of Mg can change in a step configuration with a high change rate. For example, the controllability of the threshold voltage is improved, and a stable threshold is easily obtained.

For example, the carbon concentration in the third region 13 is not less than $3 \times 10^{16}/cm^3$ and not more than $5 \times 10^{17}/cm^3$. Thereby, for example, the Mg concentration in the third region 13 is more easily controlled.

For example, the carbon concentration in the second region 12 is not less than $2 \times 10^{15}/cm^3$ and not more than $2 \times 10^{16}/cm^3$. Thereby, for example, the concentration of Mg can change in a step configuration with a high change rate. For example, the controllability of the threshold voltage is improved, and a stable threshold is easily obtained.

In one example as shown in FIG. 7, the carbon concentration in the first region 11 is less than the carbon concentration in the third region 13. For example, by setting the carbon concentration in the first region 11 to be low, the function of the p-type conductivity of the Mg in the first region 11 is effectively obtained. The first region 11 substantially may not include carbon.

For example, the carbon concentration in the first region 11 may be less than the carbon concentration in the second region 12. For example, the carbon concentration in the first region 11 is not less than $1\times10^{14}/cm^3$ and not more than $2\times10^{16}/cm^3$. The carbon concentration in the first region 11 may be not less than $1\times10^{14}/cm^3$ and not more than $9\times10^{15}/cm^3$.

Figure 8A:
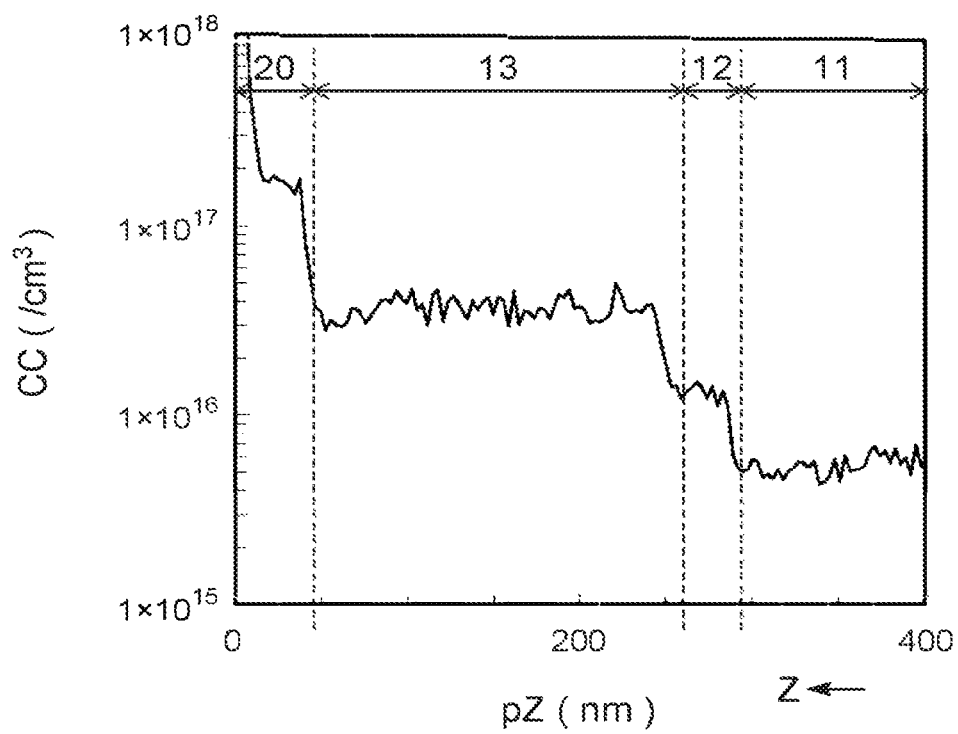
FIGS. 8A and 8B are graphs illustrating characteristics of semiconductor devices.
Figure 8B:
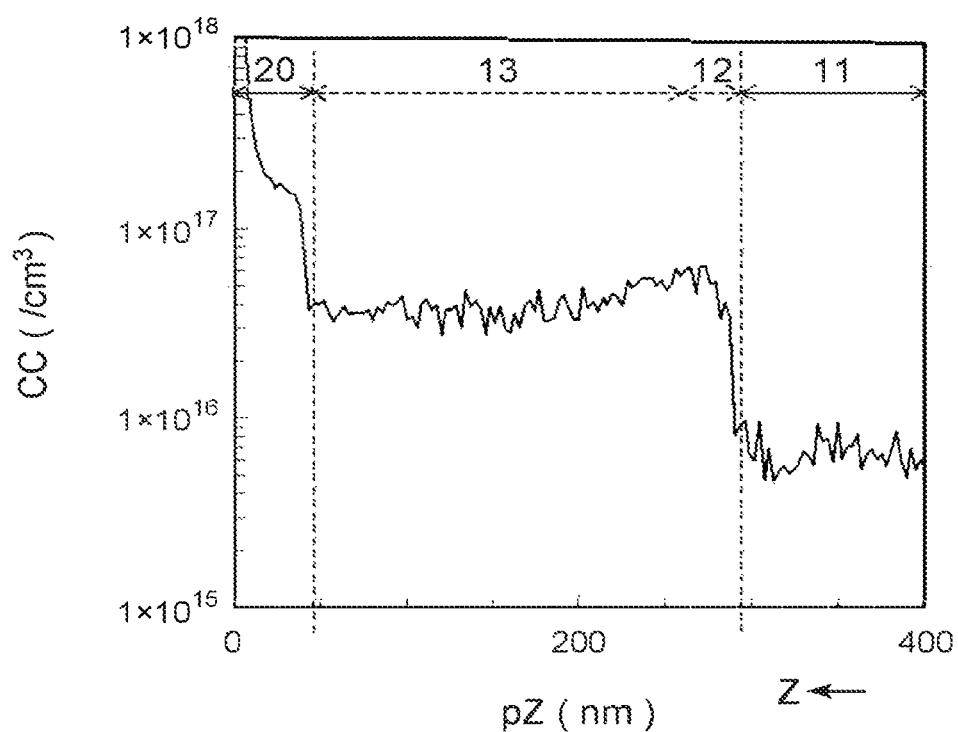

FIGS. 8A and 8B are graphs illustrating characteristics of semiconductor devices.

FIG. 8A illustrates SIMS analysis results of the carbon concentration in the first sample SP1. As described above, the second partial pressure is greater than the first partial pressure when manufacturing the first sample SP1. For the first sample SP1, the third partial pressure is greater than the first partial pressure. FIG. 8B corresponds to the second sample SP2 described above. When manufacturing the second sample SP2, the second partial pressure is equal to the first partial pressure, and the third partial pressure is equal to the first partial pressure.

In the first sample SP1 as shown in FIG. 8A, the carbon concentration in the second region 12 is greater than the carbon concentration in the first region 11. In the first sample SP1, the carbon concentration in the third region 13 is greater than the carbon concentration in the second region 12. In the first sample SP1, the carbon concentration in the second region 12 is greater than the carbon concentration in the first region 11 and less than the carbon concentration in the third region 13.

For the first sample SP1 described above, the third partial pressure is less than the second partial pressure. It is considered that carbon is easily incorporated when the third partial pressure is less than the second partial pressure. It is considered that carbon is more easily incorporated into the third region 13 by setting the third partial pressure to be less than the second partial pressure.

Thus, the semiconductor device according to the embodiment includes the substrate 10s, and the first semiconductor layer 10 that includes magnesium and $Al_{x1}Ga_{1-x1}N$ (0≤x1<1). The first semiconductor layer 10 includes the first region 11, the second region 12, and the third region 13. The first region 11 is between the substrate 10s and the third region 13. The second region 12 is between the first region 11 and the third region 13. The concentration CMg0 of magnesium in the first region 11 is greater than the concentration CMg0 of magnesium in the third region 13. The concentration CMg0 of magnesium in the second region 12 decreases along the first orientation (the +Z orientation), which is from the substrate toward the first semiconductor layer 10. The third region 13 includes carbon, and the second region 12 does not include carbon. Or, the carbon concentration in the third region 13 is greater than the carbon concentration in the second region 12.

Figure 9:
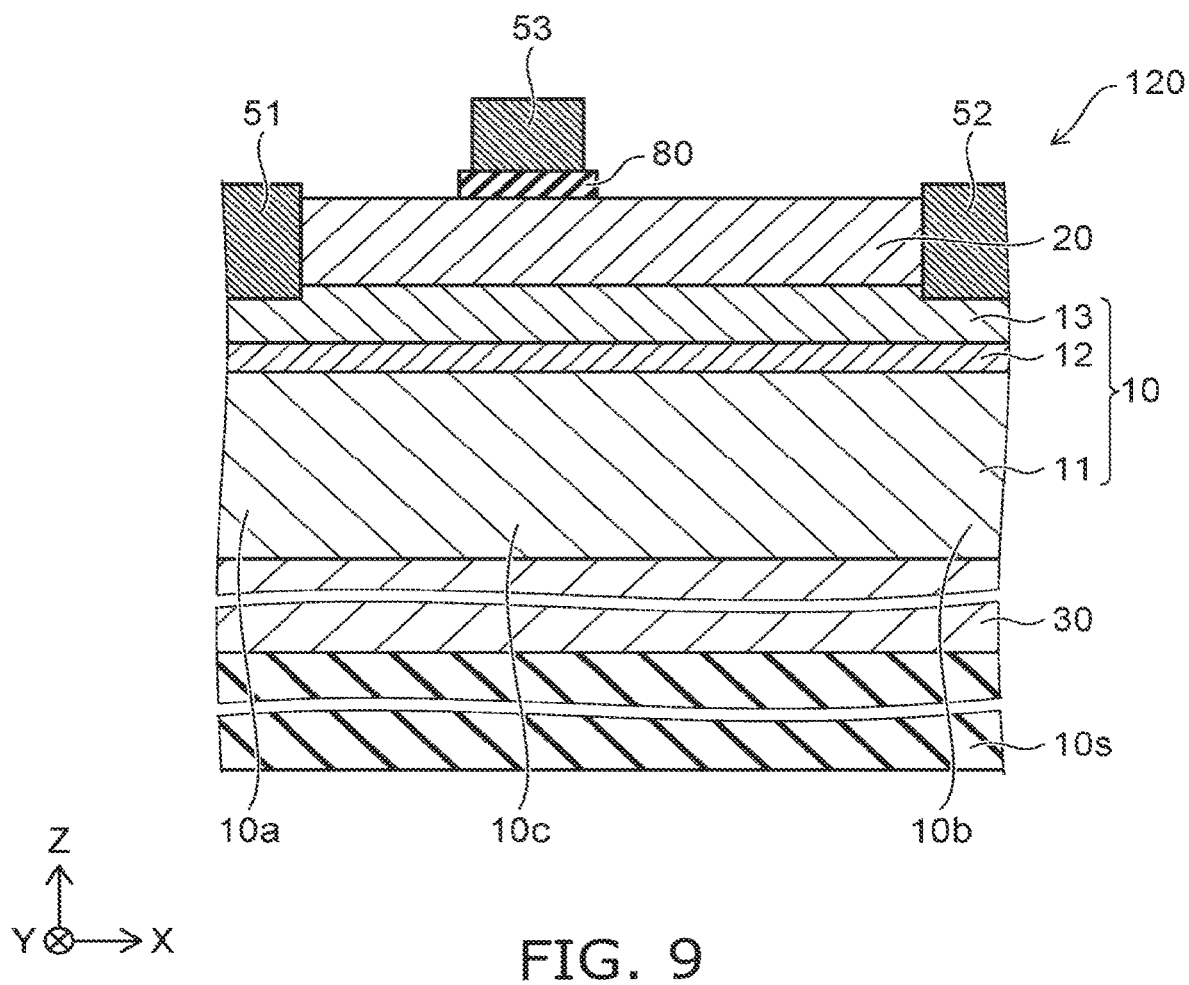
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, the semiconductor device 120 according to the embodiment includes a first electrode 51, a second electrode 52, and a third electrode 53 in addition to the substrate 10s, the first semiconductor layer 10, and the second semiconductor layer 20. In the example, the semiconductor device 120 includes the third semiconductor layer 30. The configurations of the substrate 10s, the first semiconductor layer 10, the second semiconductor layer 20, and the third semiconductor layer 30 of the semiconductor device 120 may be the same as those of the semiconductor device 110. Examples of the electrodes will now be described.

As shown in FIG. 9, the direction from a portion 10a of the first semiconductor layer 10 toward the first electrode 51 is along the first orientation (the +Z orientation). The direction from another portion 10b of the first semiconductor layer 10 toward the second electrode 52 is along the first orientation (the +Z orientation). A second direction from the first electrode 51 toward the second electrode 52 crosses the first orientation. The second direction is, for example, the X-axis direction. The position in the second direction of the third electrode 53 is between the position in the second direction of the first electrode 51 and the position in the second direction of the second electrode 52.

For example, in the example, a portion of the second semiconductor layer 20 is between the third electrode 53 and a portion 10c of the first semiconductor layer 10. An insulating film 80 is between the second semiconductor layer 20 and the third electrode 53.

For example, the first electrode 51 functions as a source electrode. For example, the second electrode 52 functions as a drain electrode. For example, the third electrode 53 functions as a gate electrode. The semiconductor device 120 is, for example, a HEMT (High Electron Mobility Transistor).

Figure 10:
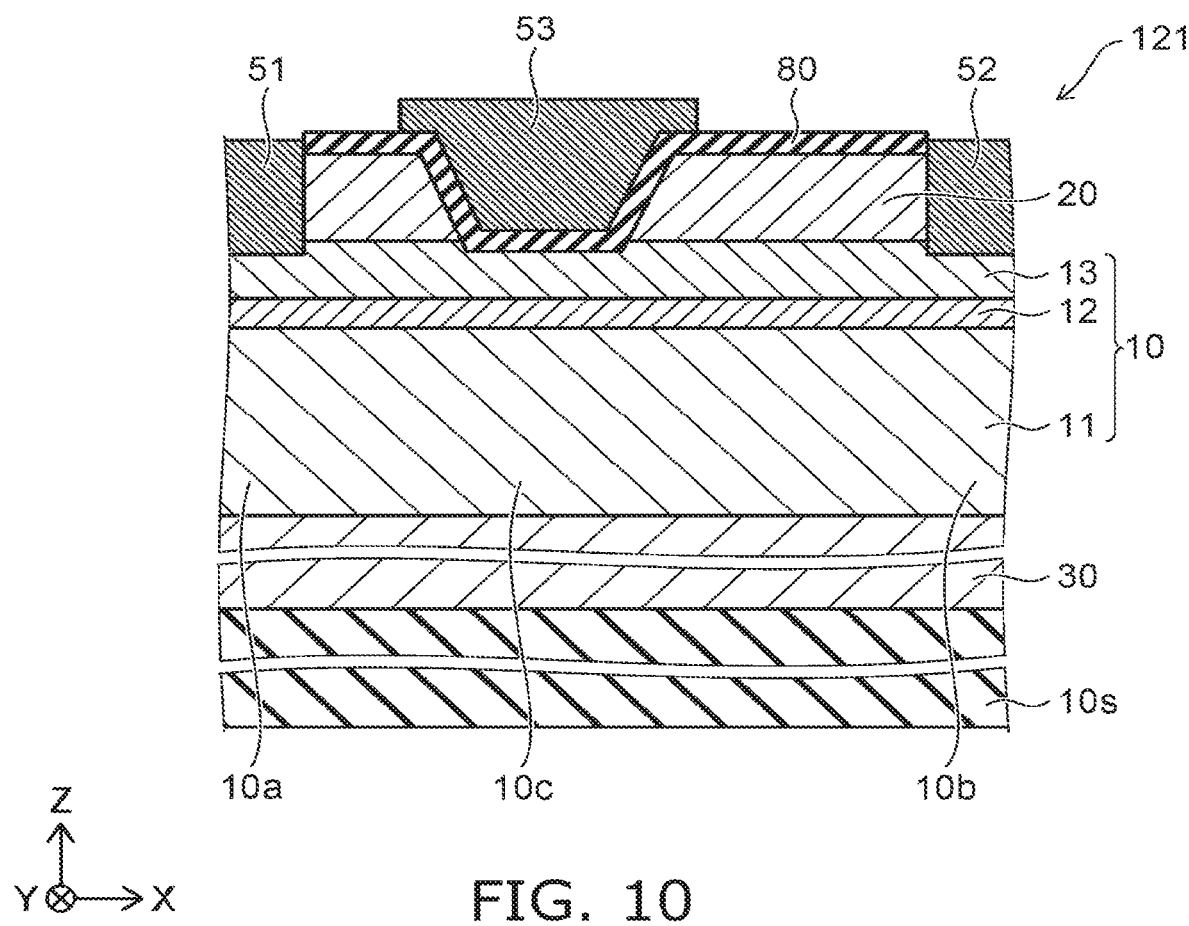
FIG. 10 is a schematic cross-sectional view illustrating a semiconductor device according to the first embodiment.
Figure 11:
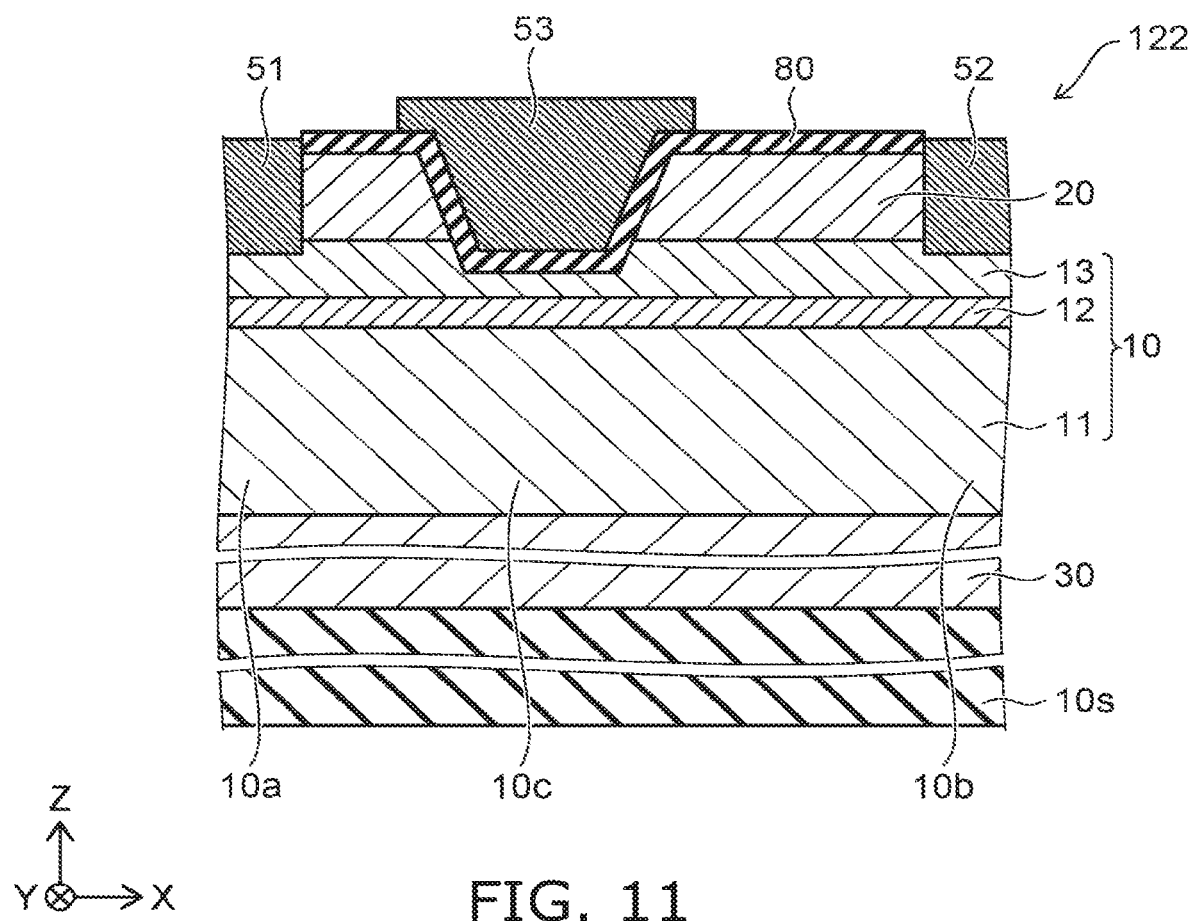
FIG. 11 is a schematic cross-sectional view illustrating a semiconductor device according to the first embodiment.

FIGS. 10 and 11 are schematic cross-sectional views illustrating semiconductor devices according to the first embodiment. As shown in FIGS. 10 and 11, the semiconductor devices 121 and 122 according to the embodiment also include the substrate 10s, the first semiconductor layer 10, the second semiconductor layer 20, the first electrode 51, the second electrode 52, the third electrode 53, and the Insulating film 80.

In the semiconductor devices 121 and 122, the direction from at least a portion of the third electrode 53 toward the second semiconductor layer 20 is along the X-axis direction. The semiconductor devices 121 and 122 include, for example, recessed gate electrodes. In the semiconductor device 121, the direction from at least a portion of the third electrode 53 toward a portion of the second semiconductor layer 20 is along the X-axis direction. In the semiconductor device 122, the direction from at least a portion of the third electrode 53 toward a portion of the first semiconductor layer 10 is along the X-axis direction.

In the semiconductor devices 120, 121, and 122, the first semiconductor layer 10 includes the first region 11, the second region 12, and the third region 13 described above. Thereby, for example, a stable threshold voltage Vth is obtained.

Second Embodiment

A second embodiment relates to a method for manufacturing a semiconductor device.

Figure 12A:
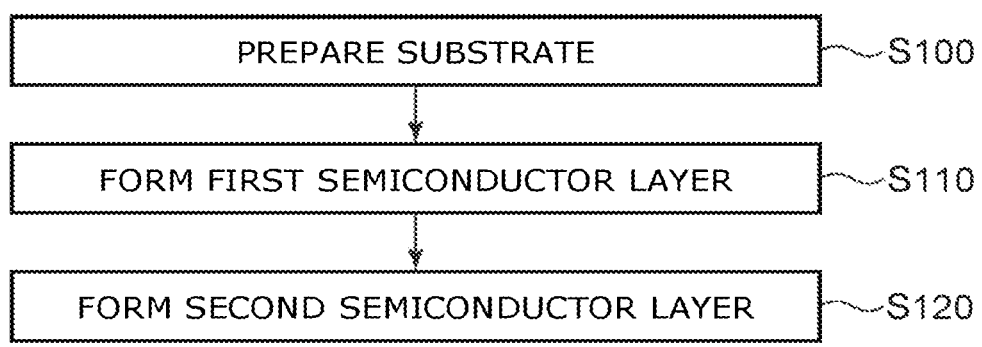
FIGS. 12A and 12B are flowcharts illustrating a method for manufacturing a semiconductor device according to a second embodiment.
Figure 12B:
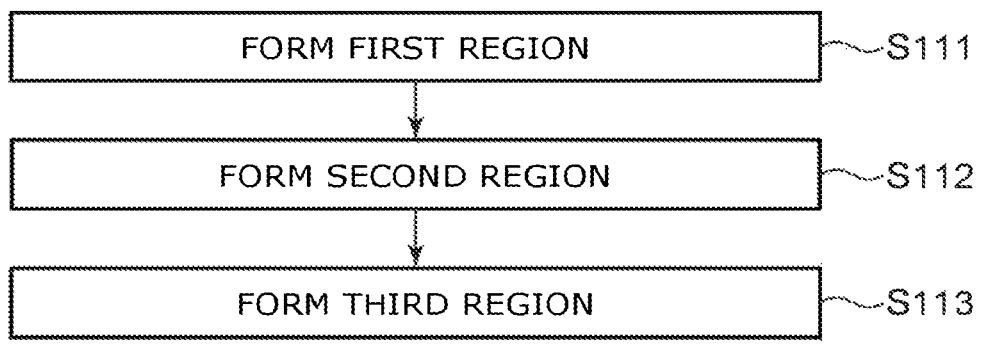

FIGS. 12A and 12B are flowcharts illustrating the method for manufacturing the semiconductor device according to the second embodiment.

In the manufacturing method as shown in FIG. 12A, the substrate 10s is prepared (step S100). The third semiconductor layer 30 may be provided on the substrate 10s.

The first semiconductor layer 10 is formed on the substrate 10s (step S110). The first semiconductor layer 10 includes magnesium and $Al_{x1}Ga_{1-x1}N$ (0≤x1<1). The formation of the first semiconductor layer 10 is performed using a gas including ammonia, a raw material including gallium, and a raw material including magnesium.

As shown in FIG. 12A, the second semiconductor layer 20 also may be formed (step S120).

FIG. 12B illustrates the formation of the first semiconductor layer 10. As shown in FIG. 12B, the formation of the first semiconductor layer 10 (step S110) includes the formation of the first region 11 (step S111), the formation of the second region 12 (step S112), and the formation of the third region 13 (step S113).

In the formation of the first region 11, the first region 11 is formed using the first gas that includes ammonia with the first partial pressure, a raw material including gallium, and a raw material including magnesium.

The formation of the second region 12 is performed after the formation of the first region 11. In the formation of the second region 12, the second region 12 is formed using the second gas that includes ammonia with the second partial pressure and a raw material including gallium. The second partial pressure is greater than the first partial pressure.

The formation of the third region 13 is performed after the formation of the second region 12. In the formation of the third region 13, the third region 13 is formed using the third gas that includes ammonia with the third partial pressure and a raw material including gallium. In one example, the third partial pressure is less than the second partial pressure. In one other example, the third partial pressure is equal to the second partial pressure.

In the manufacturing method according to the embodiment, the second partial pressure is greater than the first partial pressure. Thereby, the Mg concentration in the second region 12 can be reduced (in a step configuration) with a high change rate. On the other hand, the third partial pressure is not more than the second partial pressure. The change of the Mg concentration in the third region 13 can be reduced thereby. Thereby, for example, the fluctuation of the threshold voltage Vth can be suppressed. In the embodiment, a method for manufacturing a semiconductor device can be provided in which the characteristics can be improved.

In the embodiment, the first partial pressure is, for example, not less than 5 kPa and not more than 15 kPa. The second partial pressure is, for example, not less than 36 kPa and not more than 60 kPa. The third partial pressure is, for example, not less than 20 kPa and not more than 35 kPa.

In the embodiment, the substrate 10s includes, for example, silicon. The substrate 10s may include, for example, sapphire, SiC, or GaN. The third semiconductor layer 30 includes, for example, AlN. The third semiconductor layer 30 may include, for example, a stacked body in which multiple AlGaN layers are stacked. The third semiconductor layer 30 may have, for example, a superlattice structure in which a GaN layer and an AlN layer are periodically stacked.

According to the embodiments, a semiconductor device and a method for manufacturing the semiconductor device can be provided in which the characteristics can be improved.

In the embodiment, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the Invention by appropriately selecting specific configurations of components included in semiconductor devices such as substrates, semiconductor layers, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the Invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a substrate; and
   a first semiconductor layer including magnesium and $Al_{x1}Ga_{1-x1}N$ ($0 \leq x1 < 1$),
   the first semiconductor layer including a first region, a second region, and a third region,
   the first region being between the substrate and the third region,
   the second region being between the first region and the third region,
   a first concentration of magnesium in the first region being greater than a third concentration of magnesium in the third region,
   a second concentration of magnesium in the second region decreasing along a first orientation,
   the first orientation being from the substrate toward the first semiconductor layer,
   the first region not including carbon, or
   a concentration of carbon in the first region being lower than a concentration of carbon in the second region.

2. The device according to claim 1, wherein the third concentration decreases along the first orientation.

3. The device according to claim 1, wherein a second change rate of a logarithm of the second concentration with respect to a change of a position along the first orientation is greater than a third change rate of a logarithm of the third concentration with respect to the change of the position along the first orientation.

4. The device according to claim 3, wherein a first change rate of a logarithm of the first concentration with respect to the change of the position along the first orientation is less than the third change rate.

5. The device according to claim 3, wherein
the second change rate is not less than 0.01 and not more than 0.2 in units of $(\log_{10}(1/\text{cm}^3))/\text{nm}$.

6. The device according to claim 3, wherein
the third change rate is not less than 0.0001 and not more than 0.002 in units of $(\log_{10}(1/\text{cm}^3))/\text{nm}$.

7. The device according to claim 1, wherein
the third region includes carbon and the second region does not include carbon, or
a concentration of carbon in the third region is greater than a concentration of carbon in the second region.

8. The device according to claim 7, wherein
the concentration of carbon in the third region is not less than $3\times10^{16}/\text{cm}^3$ and not more than $5\times10^{17}/\text{cm}^3$, and
the concentration of carbon in the second region is not less than $2\times10^{15}/\text{cm}_3$ and not more than $2\times10^{16}/\text{cm}^3$.

9. The device according to claim 1, wherein
the concentration of carbon in the first region is not less than $1\times10^{14}/\text{cm}^3$ and not more than $2\times10^{16}/\text{cm}^3$.

10. The device according to claim 1, wherein
a thickness along the first orientation of the third region is not less than 10 nm and not more than 1000 nm.

11. The device according to claim 1, wherein
a thickness along the first orientation of the second region is not less than 5 nm and not more than 200 nm.

12. The device according to claim 1, wherein
an average value in the third region of the third concentration is not more than 1/10 of an average value in the first region of the first concentration.

13. The device according to claim 1, wherein
an average value in the third region of the third concentration is $5\times10^{16}/\text{cm}^3$ or less.

14. The device according to claim 1, wherein
an average value in the first region of the first concentration is not less than $5\times10^{16}/\text{cm}^3$ and not more than $5\times10^{18}/\text{cm}^3$.

15. The device according to claim 1, further comprising:
a third semiconductor layer including a nitride semiconductor including Al,
the third semiconductor layer being between the substrate and the first semiconductor layer.

16. The device according to claim 1, further comprising:
a second semiconductor layer including $Al_{x2}Ga_{1-x2}N$ ($0<x2\leq1$ and $x1<x2$),
the first semiconductor layer being between the substrate and the second semiconductor layer.

17. The device according to claim 1, further comprising:
a first electrode;
a second electrode; and
a third electrode,
a direction from a portion of the first semiconductor layer toward the first electrode being along the first orientation,
a direction from an other portion of the first semiconductor layer toward the second electrode being along the first orientation,
a second direction from the first electrode toward the second electrode crossing the first orientation, and
a position in the second direction of the third electrode being between a position in the second direction of the first electrode and a position in the second direction of the second electrode.

* * * * *